United States Patent [19]
Hayes et al.

[11] Patent Number: 6,090,152
[45] Date of Patent: Jul. 18, 2000

[54] METHOD AND SYSTEM FOR USING VOLTAGE AND TEMPERATURE ADDERS TO ACCOUNT FOR VARIATIONS IN OPERATING CONDITIONS DURING TIMING SIMULATION

[75] Inventors: Jerry Dean Hayes, Milton; David Bruce White, Essex Junction, both of Vt.

[73] Assignee: International Business Machines Corporation, Armonk, N.Y.

[21] Appl. No.: 08/822,093

[22] Filed: Mar. 20, 1997

[51] Int. Cl.$^7$ .................................................. G06F 17/50
[52] U.S. Cl. .................................... 716/6; 703/14; 703/19
[58] Field of Search ................................... 364/488, 489, 364/490, 491; 395/500.4, 500.07, 500.34, 500.35, 500.36

[56] References Cited

U.S. PATENT DOCUMENTS

| | | | |
|---|---|---|---|
| 4,924,430 | 5/1990 | Zasio et al. | 364/578 |
| 5,220,187 | 6/1993 | Miyaoka et al. | 257/378 |
| 5,274,568 | 12/1993 | Blinne et al. | 364/489 |
| 5,452,225 | 9/1995 | Hammer | 364/488 |
| 5,548,526 | 8/1996 | Misheloff | 364/491 |
| 5,559,715 | 9/1996 | Misheloff | 364/488 |
| 5,687,088 | 11/1997 | Tomita | 364/491 |
| 5,748,489 | 5/1998 | Beatty et al. | 364/489 |
| 5,883,818 | 3/1999 | Salimi et al. | 364/578 |

*Primary Examiner*—Paul R. Lintz
*Assistant Examiner*—Vuthe Siek
*Attorney, Agent, or Firm*—Pollock Vande Sande & Amernick

[57] ABSTRACT

A method and system for predicting the sensitivity of the integrated circuit logic cell timing performance to variations in voltage and temperature. Rather than using the prior art approach of multiplicative derating factors to model voltage and temperature effects on timing performance, adders are used to model the change in performance due to variations in operating conditions (i.e., voltage and temperature). The adders are treated as functions of input transition time (Tx) and output load capacitance (Cload). The change in performance as measured in time forms a plane over the Tx-Cload operating range for variations in either voltage or temperature. The adders, using a plane equation as a function of Tx and Cload, greatly improve the absolute accuracy in predicting the effects of variations in voltage and temperature, as compared to using the prior art methods involving multiplicative derating factors.

20 Claims, 10 Drawing Sheets

METHOD AND SYSTEM FOR USING VOLTAGE AND TEMPERATURE ADDERS TO ACCOUNT FOR VARIATIONS IN OPERATING CONDITIONS DURING TIMING SIMULATION

TECHNICAL FIELD OF THE INVENTION

The present invention relates to the field of integrated circuit simulation. More particularly, the invention relates to a method and system for predicting timing performance associated with integrated circuit logic cells.

BACKGROUND OF THE INVENTION

To remain competitive in today's ASIC (application specific integrated circuit) market, circuit designers are becoming increasingly sensitive to maximizing circuit performance by utilizing the last few nanoseconds (ns) or even picoseconds (ps) of performance a given technology has to offer. This places increasingly higher demands on the accuracy of the simulation tool used for predicting timing delays and output transition times. However, with each increase in the accuracy of predicting timing delays and output transition times comes an increase in simulation time.

The desired balance between accuracy and simulation time plays a major role in determining the simulation method used. chosen where calibration points as a function of Tx and Cload are obtained to characterize the circuit performance. To account for variations in voltage, temperature, and process, the industry standard method utilizes multiplicative derating factors to scale the propagation delay (or output transition time) from the base operating conditions. The multiplicative derating factors used in the industry today can result in varying degrees of timing inaccuracies.

To account for variations in two of the three variables that define an operating condition (i.e. voltage and temperature), a multiplicative derating factor for each variable is used. These derating factors, sometimes referred to as k-factors, are used to scale the base delay, as shown below in equation 1, where the base delay is the delay at the base operating condition.

$$DELAY_{V_{DD}/TEMP} = \qquad (1)$$
$$DELAY_{BASE}[1 + K_V(V_{DD} - V_{BASE})][1 + K_T(TEMP - T_{BASE})]$$

Note that the third variable, process, is typically defined as part of the base line condition. This requires that calibration points be generated for each case (i.e. best, nominal, and worst), and that each case defines its own unique table or equation, thus eliminating the need for a process derating factor. Another prior art approach defines worst For example, one prior art approach resulting in extremely accurate timing is the use of an analog circuit simulator. Although the required simulation time when using an analog circuit simulator may be tolerable for small circuits, using an analog simulator quickly becomes prohibitive for larger circuit layouts.

An alternative prior art approach is the use of a digital timing simulator with a method that greatly reduces simulation time, while achieving the desired level of accuracy in predicting input to output delay and output transmission rates. To achieve this, the prior art methods encode calibration points obtained from an analog simulator in a way unique to the particular method used. For example, some prior art methods use the calibration points as table entries and then use some form of interpolation to predict values between the calibration points, while others use the calibration points as curve fitting data for generating multiple term equations that are used in predicting delay and transition times.

Whether using a table or an equation, most prior art methods, at a given operating condition (i.e. voltage, temperature and process), become a two dimensional function of the input transition time, Tx, and the output load capacitance, Cload. A base operating condition is typically case as the base process condition and then uses a process derating factor to calculate the nominal and best case process delays.

The $K_V$ and $K_T$ variables are the k-factors used to account for variations in operating conditions. By assuming $K_V$ is independent of temperature and $K_T$ is independent of voltage, the following equations can be used to express $K_V$ and $K_T$ as functions of voltage and temperature respectively, as shown below in equations 2 and 3.

$$K_V = \frac{[DELAY_{V_{DD}} / DELAY_{BASE}] - 1}{V_{DD} - V_{BASE}} \qquad (2)$$
$$\text{where } TEMP = T_{BASE}$$

$$K_T = \frac{[DELAY_{TEMP} / DELAY_{BASE}] - 1}{TEMP - T_{BASE}} \qquad (3)$$
$$\text{where } V_{DD} = V_{BASE}$$

Note that two assumptions are made in the way k-factors are used. The first assumption is that the change in base delay to a change in one operating condition parameter is independent of the other parameter. Although this assumption is valid for first order approximations, there have been some second order coupling effects observed between voltage and temperature. The second assumption is that the change in base delay to a change in either voltage or temperature is linear. Therefore, if an x change in voltage causes a y change in delay, then a 2x change in voltage will cause a 2y change in delay. Although this assumption is valid for small-signal variations of $V_{DD}$ (i.e. +/−10%), some second order effects (and possibly third order effects) would be expected for greater variations of $V_{DD}$ (i.e. +/−30%).

Historically, values for $K_V$ and $K_T$ have been obtained during calibration by measuring the base delay at a single Tx-Cload characterization point and observing the change in delay caused by a change in voltage or temperature. These values are then used during simulation for all Tx-Cload combinations.

Figure 1:
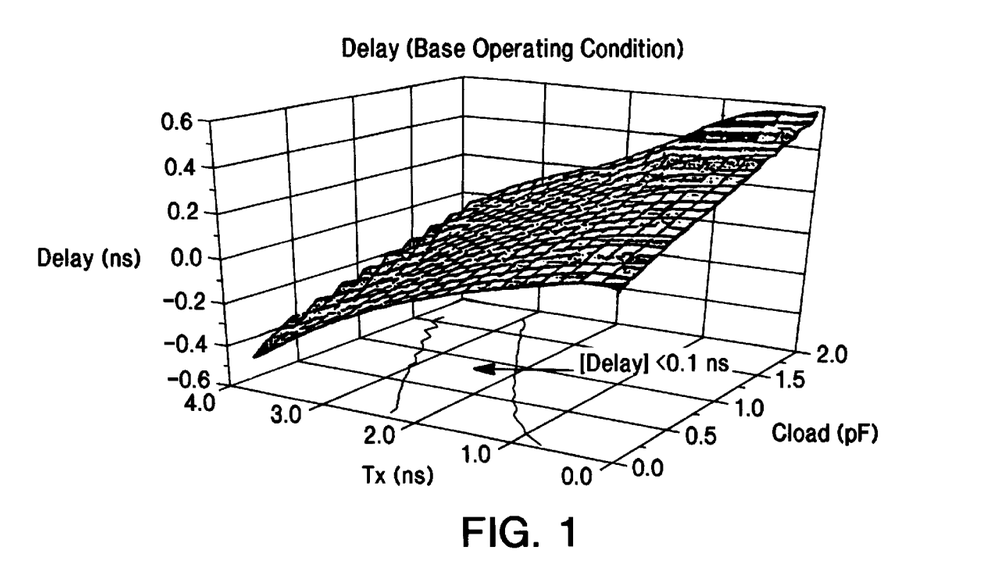
FIG. 1 is a three-dimensional graph plotting the delay for a given timing path as a function of input transition time (Tx) and output loading capacitance (Cload)

A salient characteristic of equations 2 and 3 is their intrinsic sensitivity to the magnitude of the delay at the base operating condition. For a given timing path, the base delay can vary greatly as a function of Cload and Tx. This is shown in FIG. 1. Note that negative delays can occur with large input transition times or light output loads when using a midpoint voltage threshold on both the input and output. FIG. 1 depicts the delay for a given timing path as a function of input transition time (Tx) and output loading capacitance (Cload). The delay values in FIG. 1 were obtained using an analog circuit simulator at the base voltage and temperature using a fast process (i.e. best case process). The region bounded by the contour lines illustrates the range of Tx-Cload combinations that result in delay magnitudes of less than 0.1 ns.

Figure 2:
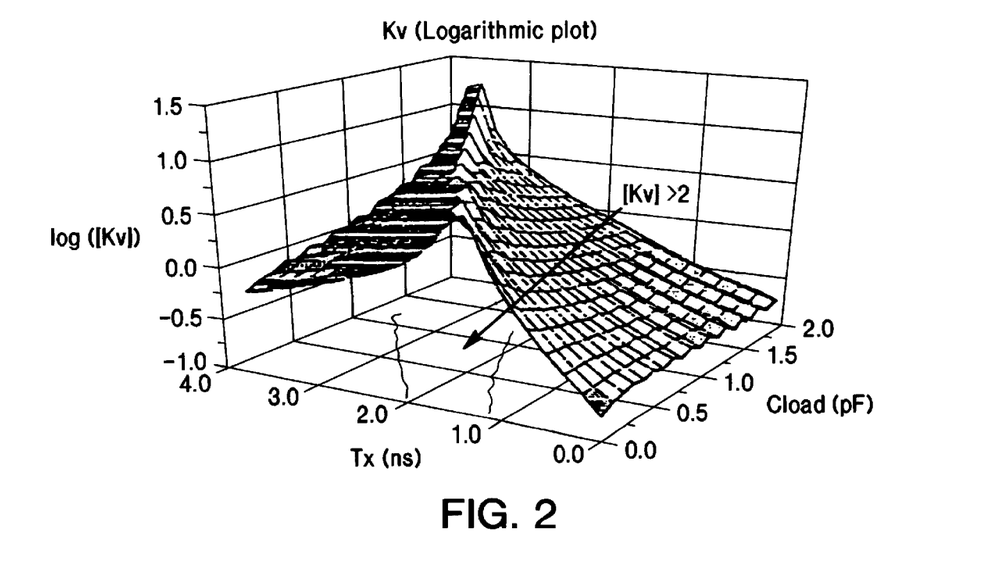
FIG. 2 is a three-dimensional graph plotting the range of values obtained for $K_V$ using the base delays shown in FIG. 1, and changing 0.6 volts from the base operating condition.

To illustrate the sensitivity of $K_V$ to the magnitude of the base delays shown in FIG. 1, delay values were acquired with an analog simulator over the same Tx-Cload range using a $V_{DD}$ that was 0.6 volts from the base operating condition. These delay values and the base values in FIG. 1 were used in equation 2 to obtain the range of $K_V$ values shown in FIG. 2. FIG. 2 illustrates the range of values obtained for $K_V$ using the base delays in FIG. 1 and changing 0.6 volts from the base operating condition. The region bounded by the contour lines in FIG. 2 represents the range of Tx-Cload combinations with a $K_V$ magnitude greater than two. A logarithmic scale was chosen for FIG. 2 in order to highlight the wide variation of $K_V$ values across the entire Tx-Cload range. Note that the contour of base delay values ranging from −0.1 to 0.1 nanoseconds in FIG. 1 shows a high degree of correlation with the erratic peak range of $K_V$ values in FIG. 2.

Due to the similarities of equations 1 and 2, the sensitivity of $K_T$ to the magnitude of the base delay is similar to FIG. 2. It can be seen from equation 2 that as the base delay asymptotically approaches zero the value for $K_V$ goes to infinity. In other words, $K_V$ is inversely proportional to the base delay. As technologies become faster (i.e. as base delays gets closer to zero), the sensitivity of $K_V$ to variations in delay will increase. This increase in sensitivity causes an increase in the variation of $K_V$ across the Tx-Cload range, which in turn increases the error when using one $K_V$ value for all Tx-Cload combinations. In other words, faster technologies will result in smaller propagation delays (i.e. smaller $DELAY_{BASE}$), resulting in larger k-factors, which in turn leads to larger prediction errors.

Figure 3:
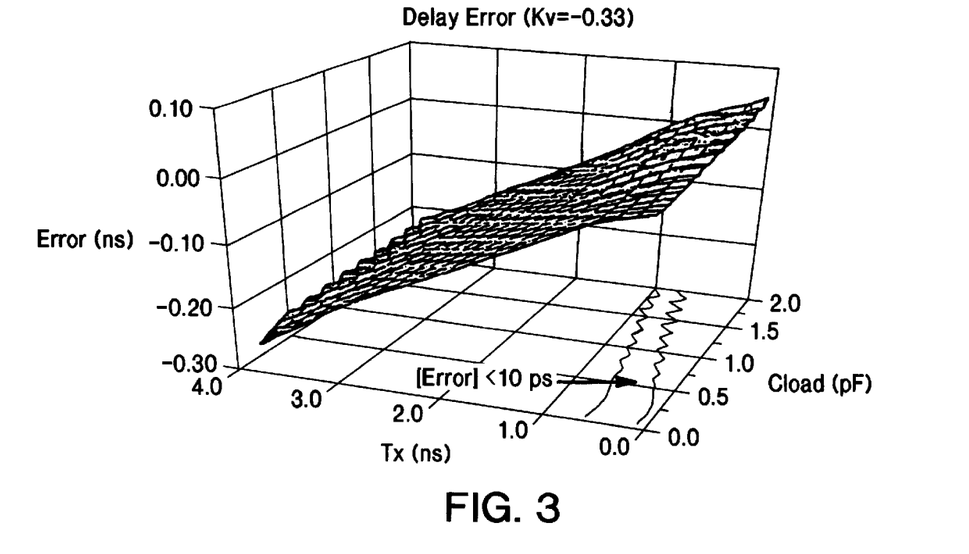
FIG. 3 is a three-dimensional graph depicting the errors resulting when a typical voltage multiplier of −0.33 is used to scale the base propagation delay for a 600 mV shift in $V_{DD}$.

Even when using a typical $K_V$ of −0.33, as shown in FIG. 3, the resultant errors are large. The contour lines in FIG. 3 indicate the very small region of Tx-Cload combinations that results in a digital simulation error of less than 10 ps.

One approach to reducing the errors associated with using a single $K_V$ and $K_T$ factor would be to generate $K_V$ and $K_T$ as functions of Tx and Cload. If we consider the Tx and Cload grid as a two dimensional spatial area, both $K_V$ and $K_T$ exhibit high spatial variations across this area. These high variations require a high degree of resolution in characterizing a k-factor across this grid, which in turn would increase the complexity of the equations needed.

A prior art approach which attempts to provide more accurate delay time estimates is found in U.S. Pat. No. 5,274,568, issued Dec. 28, 1993, to Blinne et al. (hereinafter "Blinne"). The method taught in Blinne adds a correction factor to a base delay time. However, Blinne uses the industry standard multiplicative derating factor to model process, temperature, and voltage effects both when calculating the base delay time and when calculating the correction factor. Because Blinne uses a multiplicative derating factor to model process, temperature, and voltage effects, Blinne does not teach nor suggest the present invention as claimed herein.

Consequently, it would be desirable to have a system and method for more accurately predicting timing delays and output transition times for integrated circuit logic cells. It would be desirable to have a system and method which is easy to use, and which increases accuracy without any significant increase in simulation time.

SUMMARY OF THE INVENTION

Accordingly, the present invention teaches a method and system for predicting the sensitivity of integrated circuit logic cell timing performance to variations in voltage and temperature. Rather than using the prior art approach of multiplicative derating factors to model voltage and temperature effects on timing performance, adders are used to model the change in performance due to variations in operating conditions (i.e. voltage and temperature). The adders are treated as functions of input transition time (Tx) and output load capacitance (Cload), and are shown to greatly improve the absolute accuracy of the timing simulation as compared to using multipliers.

As the magnitude of the base delay becomes smaller, an increase in the variation of $K_V$ and $K_T$ across the Tx-Cload range occurs, which in turn increases the error when using the prior art approach of one $K_V$ and one $K_T$ value for all Tx-Cload combinations. Some of the factors that contribute to small base delay values are fast processes and technologies, large input transition times, light output loads, and single stage books with small intrinsic delays. The method and system of the present invention utilizes an adder as a function of Tx and Cload, which is used to predict the net change in performance to the base delay. The change in performance as measured in time forms a plane over the Tx-Cload operating range for variations in either voltage or temperature. The adders, using a plane equation as a function of Tx and Cload, greatly improve the absolute accuracy in predicting the effects of variations in voltage and temperature, as compared to using the prior art methods involving multiplicative derating factors.

An advantage of the present invention is that it more accurately predicts timing delays and the change in performance due to variations in operating conditions, such as temperature and voltage, without significantly increasing simulation time.

BRIEF DESCRIPTION OF THE DRAWINGS

The foregoing and other features and advantages of the present invention will become more apparent from the detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

The present invention discloses an alternative to using a multiplicative derating factor, such as $K_V$ or $K_T$, when predicting timing delays through integrated circuit logic cells. The method and system of the present invention uses an additive term to model the change in performance that results when moving off the base operating condition (i.e. to an off baseline temperature and/or off baseline voltage).

Figure 4:
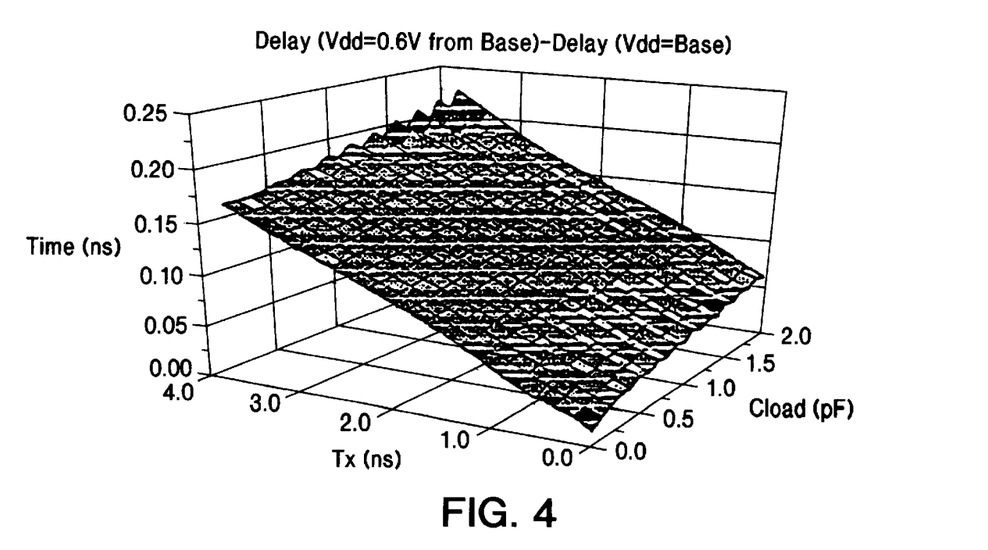
FIG. 4 is a three-dimensional graph plotting the change in delay when changing 0.6 volts from a base operating voltage.

Referring now to FIG. 4, the change in delay as a function of Tx and Cload, when changing 0.6 volts from a base line voltage, is shown. The measurements depicted in FIG. 4 were obtained using an analog circuit simulator. FIG. 4 illustrates the planar nature of the change in performance when measured in time across a range of Tx and Cload values. As can be seen in FIG. 4, there are relatively low spatial variations across the Tx and Cload grid. Thus, FIG. 4 suggests that a plane equation in the form of K1*Tx+K2*Cload+K3 (where K1, K2 and K3 are weighting coefficients determined prior to digital simulation) can be used in characterizing the effect due to variations in voltage. The plane equation can then be used to determine the time to be added to the base delay as a function of Tx, Cload, and voltage as shown in equation 4.

$$DELAY_{VDD} = DELAY_{BASE} + [K_1 Tx + K_2 Cload + K_3](V_{DD} - V_{BASE}) \quad (4)$$

Figure 5:
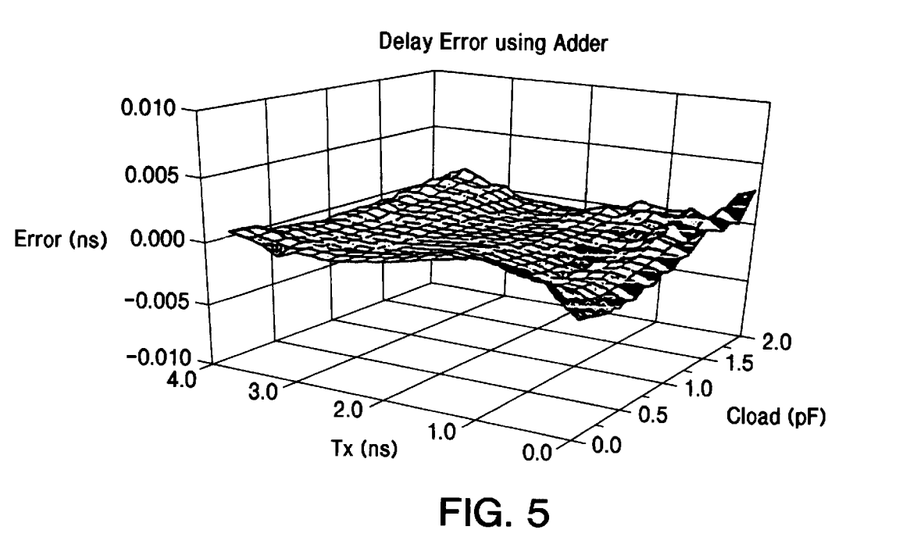
FIG. 5 is a three-dimensional graph plotting the error in delay prediction when using an adder, according the method of the present invention, to adjust the base delay.

As a comparison to the large error illustrated in FIG. 3, which resulted when using a typical single $K_V$ multiplier to scale the base value, FIG. 5 shows the error in delay prediction when using equation 4 to adjust the base delay values when changing 0.6 volts from the base voltage (the errors are computed by comparing the predicted delay to the actual delay as measured by an analog simulator). FIG. 5 shows a significant reduction in maximum error when using an adder as a function of Tx and Cload, as compared to using the $K_V$ value, as depicted in FIG. 3. Note that similar improvements in accuracy can be realized when using equation 5 to account for variations in temperature as a function of Tx and Cload.

$$DELAY_{TEMP} = DELAY_{BASE} + [K_4 Tx + K_5 Cload + K_6](TEMP - T_{BASE}) \quad (5)$$

Equations 4 and 5 can be combined to form equation 6, which is used to model the change in performance due to variations in temperature and voltage.

$$DELAY_{VDD/TEMP} = \quad (6)$$
$$DELAY_{BASE} + [K_1 Tx + K_2 Cload + K_3](V_{DD} - V_{BASE}) +$$
$$[K_4 Tx + K_5 Cload + K_6](TEMP - T_{BASE})$$

In order to address second order effects for large signal $V_{DD}$ variations, three weighting coefficients can be added to equation 6 to form equation 7. Equation 7 is the preferred form to support an extended voltage operating range.

$$DELAY_{VDD/TEMP} = DELAY_{BASE} + \quad (7)$$
$$[K_1 Tx + K_2 Cload + K_3](V_{DD} - V_{BASE}) + [K_4 Tx + K_5 Cload + K_6] +$$
$$(TEMP - T_{BASE}) + [K_7 Tx + K_8 Cload + K_9](V_{DD} - V_{BASE})^2$$

Equation 7 is implemented in a delay rule by coding it in a language known as DCL (Delay Calculator Language), and then compiling it and loading it into a timing calculation tool referred to as EinsTimer (EinsTimer is a trademark of International Business Machines Corporation).

FIGS. 6 through 9 depict the process of calculating the propagation delay and output transition time through a logic cell, according to the method of the present invention. While the described embodiment is depicted using references to IBM developed tools and software, there is nothing that would preclude implementing the unique method of the present invention using other manufacturers' toolsets.

Figure 6:
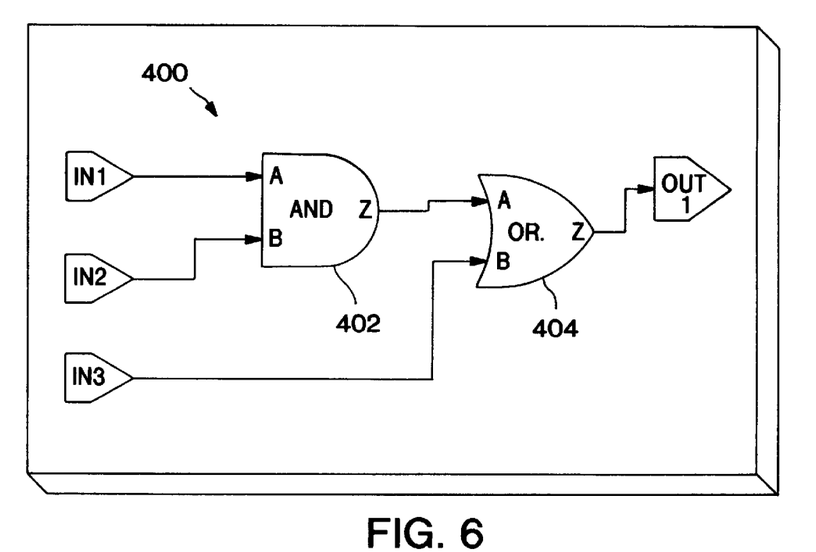
FIG. 6 is a schematic diagram of a representative set of cells to which the present invention applies.

FIG. 6 is a schematic depiction of a representative set of logic cells 400, through which it is desired to model the propagation delay and transition time for an execution signal along a given path through the cell from input to output. The delay and transition times are used by designers to predict the overall delay time for the associated cells and thereby determine whether or not the delay time is within specifications or otherwise suitable for a given circuit. Delay time and transition time modeling is useful, in general, in designing all types of integrated circuits and, in particular, in designing ASICs using cell libraries.

Still referring to FIG. 6, the illustrated logic cell is comprised of three primary input pins, IN1, IN2, and IN3. IN1 and IN2 are connected to the input pins, A and B, of AND cell 402. Output Z of AND cell 402 and IN3 are connected to input pins A and B of OR cell 404. Output Z of OR cell 404 is connected to primary output pin OUT1. Cells 400 and the particular types of cells 402 and 404 are given by way of example only and are in no sense limiting; rather, the present methodology is designed to provide accurate delay time and transition time simulations for any type of logic cell or set of logic cells.

Figure 7:
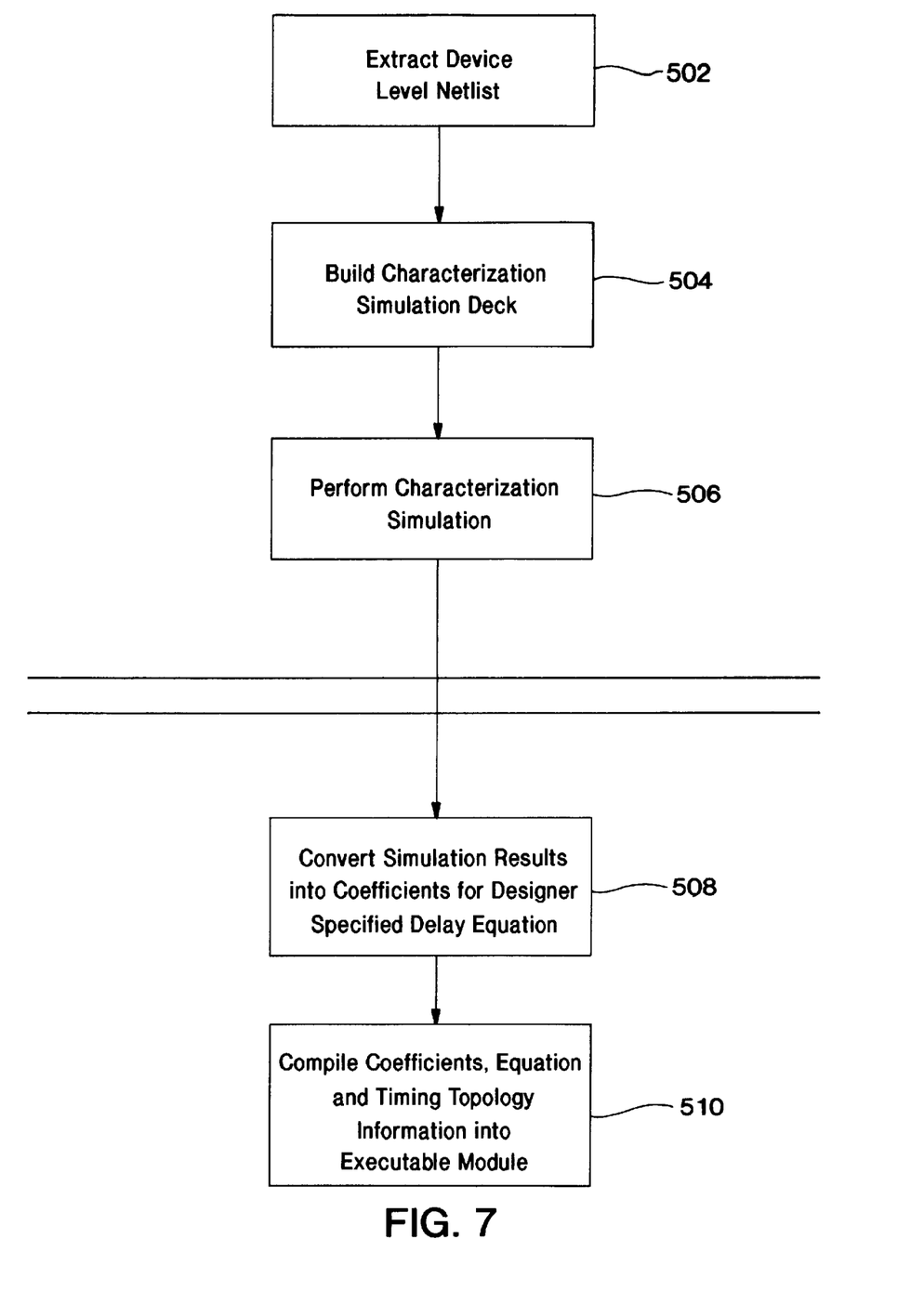
FIG. 7 is a flow diagram depicting the method used to generate an executable module encapsulating performance and timing topology information in accordance with the present invention.

FIG. 7 is a flow chart illustrating an overview of the process used to generate an executable module, which encapsulates both performance and timing topology information, and makes this information available to any timing or synthesis tool which utilizes a set of predefined Application Program Interface (API) calls. In step 502, a cell layout is converted into a device level netlist, which includes both layout-dependent and process-dependent parasitic elements. In step 504, both technology-independent and technology-dependent characterization parameters are used to take the extracted netlist and build a characterization simulation deck. In step 506, an analog simulation engine is used to perform the characterization. The analog simulation engine makes use of both technology-independent and technology-dependent characterization parameters to evaluate performance over a combination of input transition, load capacitance, process, temperature, and voltage effects. A dataset is created to record this performance information, on a per evaluation point basis.

Steps 502, 504, and 506 are repeated for each cell in the library. The resulting performance information is then loaded into a curve fitting program along with a database of equations. Equation 7 (discussed above) is one of the equations in the database, and is intended to predict propagation delay and output transition time. Other equations in the database support power dissipation, standby current, etc. In step 508, the curve fitting program converts the performance information into a set of coefficients that minimize the least squares errors for each equation in the database. The method used in step 508 is described in application Ser. No. 08/705,580, "Method For Generating An Improved Model For Evaluating The Operation Of An Integrated Circuit Design," filed on Aug. 29, 1996, and assigned to a common assignee with this application. The foregoing application is herein incorporated by reference.

Figure 8:
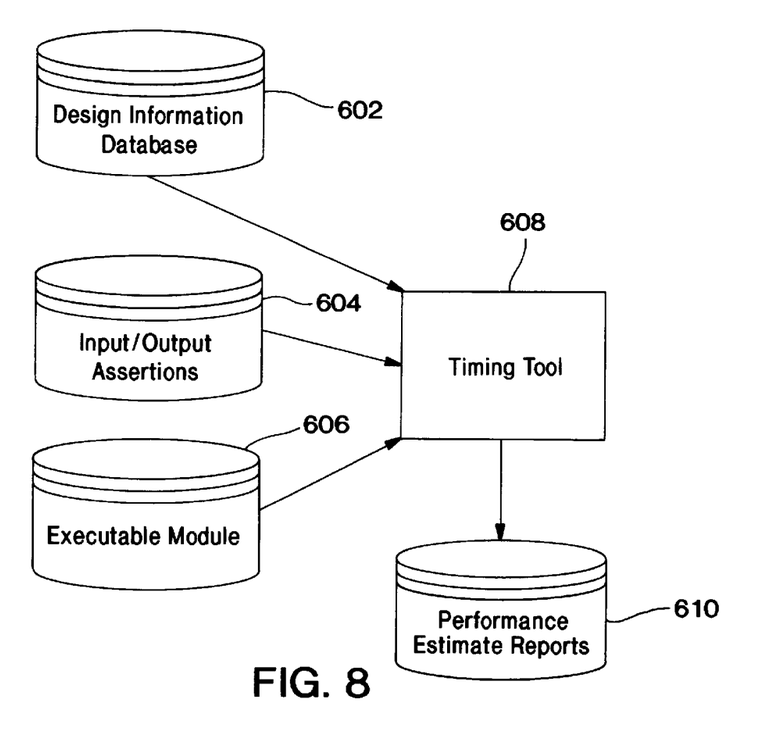
FIG. 8 is a block diagram showing the files used by a timing tool and the output of the timing tool.

The coefficients generated in step 508 are combined with timing topology information and designer specified equations, and compiled to generate an executable module in step 510. FIG. 8 is a block diagram illustrating how this executable module is used. Design Information Database 602 contains both timing topology and physical interconnect information for the design to be evaluated. File 604 contains input/output assertions, and is supplied by the designer. File 604 specifies input transition times (Tx), output pin load capacitances (Cload), and process, temperature, and voltage conditions for design evaluation. Executable module 606 (created by the process depicted in FIG. 7) corresponds to the cell library that will be used to implement the ASIC design being modeled. Timing tool 608 is used to generate performance estimate reports 610, using the process illustrated in FIG. 9.

Figure 9:
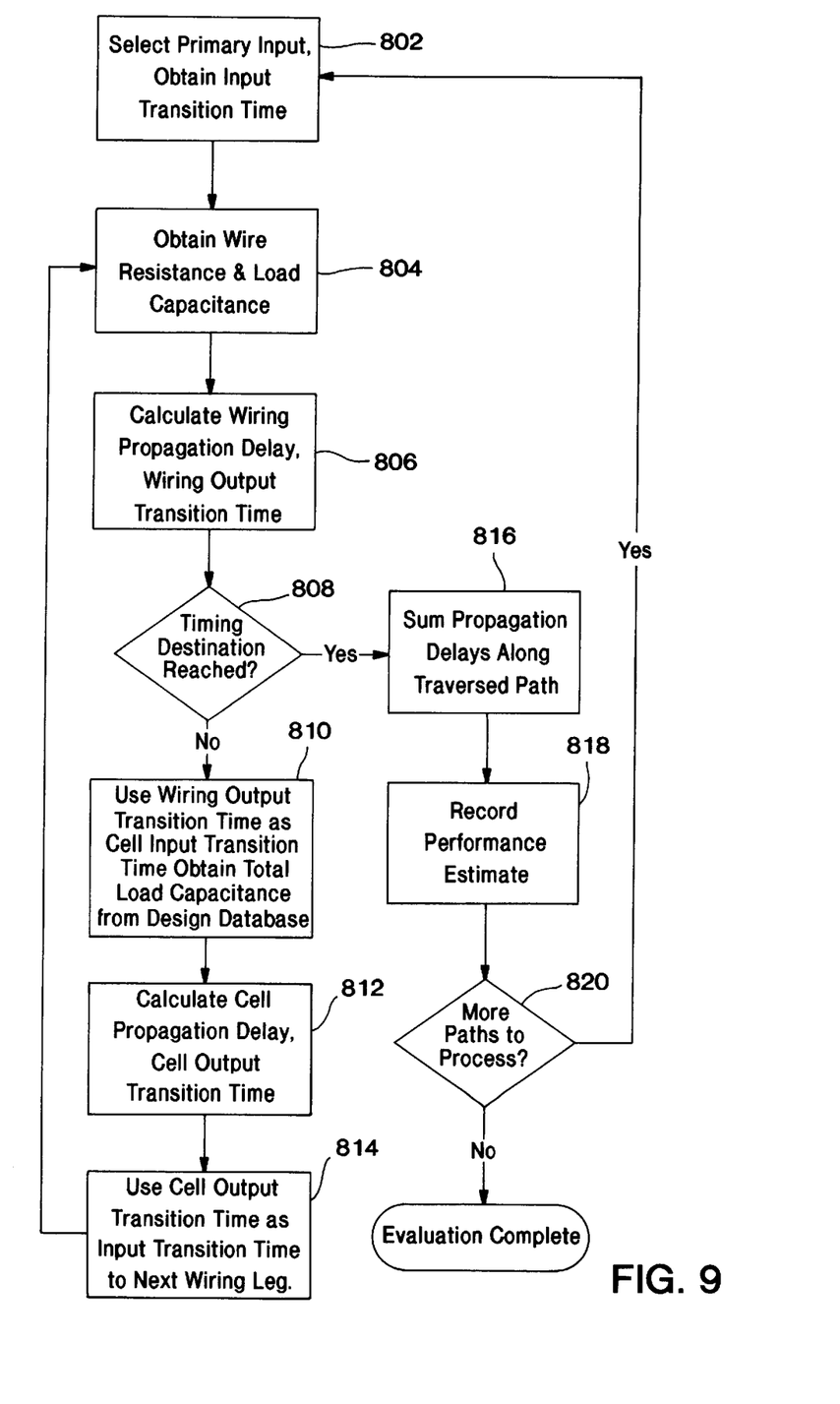
FIG. 9 is a flow chart illustrating a method of estimating design performance according to the present invention.

Referring now to FIG. 9, assume that a designer wishes to calculate propagation delay and output transition time for the cells depicted in FIG. 6. In step 802, the timing tool selects a primary input pin, for example, IN1 (depicted in FIG. 6), and obtains the input transition time for that pin from Input/Output Assertions file 604. In step 804, Design Information Database 602 specifies that there is an interconnect between the IN1 primary input pin and pin A of AND cell 402. The timing tool obtains the resistance of this interconnection, either from actual back-annotated layout information in Design Information Database 602, or from average design information and library parameters in executable module 606. The load capacitance is computed as the sum of the input capacitance of pin A of AND cell 402 (obtained from executable module 606) and the capacitance of the interconnect between primary input pin IN1 and pin A of AND cell 402 (again obtained from back-annotated or estimated numbers.)

In step 806, these numbers are used to calculate both a propagation delay through the interconnect net as well as the transition time of the signal arriving at pin A of AND cell 402. In step 808, a test is performed to determine if a timing destination has been reached. (Note that a timing destination is typically a primary output, such as OUT1, although it could be a set of two or more cell input pins when testing for race conditions between signals.)

If a timing destination has not been reached, processing continues with step 810. The transition time of the signal arriving at pin A of AND cell 402 was calculated previously in step 806. The total load capacitance of output pin Z of AND cell 402 is computed by following all nets connected to output pin Z, determining the interconnect wire capacitance (described above) and adding the termination capacitance for each net. In the case of a primary output, the termination capacitance is obtained from Input/Output Assertions file 604. For this example, the input capacitance of pin A of OR cell. 404 is obtained from the executable module and used as the termination capacitance for the Z pin of AND cell 402 to the A pin of OR cell 404. In step 812, the transition time arriving at pin A of AND cell 402 and the load present on pin Z of AND cell 402 are passed to the executable module and calls are made to calculate propagation delay through AND cell 402 and output transition time for pin Z of AND cell 402. Equation 7 (described above) is used to calculate the propagation delay and output transition time. The following DCL code section illustrates the method used to calculate propagation delay and output transition time:

/* NDR with vdd squared adder */
calc(NDRwithVddSquaredAdder ):
    passed(number: vdd, baseVdd, temp, baseTemp, loadCap,
        slewVal, capLimit, K0, K1, K2, K3, K4, K5, K6, K7,
        K8, K9, K10, K11, K12, K13, K14, K15, K16, K17,
        K18, K19, K20, K21, K22, K23, K24
    when(K10==-99999)
        result(number: -99999)
    otherwise
        result(number: ((K1*slewVal*slewVal)+(K1*slewVal)+
            K2+(K3/(slewVal+0.02)))*loadCap*loadCap+
            ((K4*slewVal*slewVal)+(K5*slewVal)+K6+(K7/
            (slewVal+0.02)))*loadCap+((K8*slewVal*slewVal)+
            (K9*slewVal)+K10+(K11/(slewVal+0.02)))+
            ((K12*slewVal*slewVal)+(K13*slewVal)+K14+(K15/
            (slewVal+0.02)))/(loadCap+1E-3)+(K16*loadCap+
            K17*slewVal+K18)*(vdd-baseVdd)+(K19*loadCap+
            K20*slewVal+K21)*(vdd-baseVdd)**2+
            (K22*loadCap+K23*slewVal+K24)*(temp-
            baseTemp));

In step 814, the input transition time is set for the next interconnect segment to have the value calculated in step 812.

This process continues with step 804, obtaining the wire resistance and load capacitance (this time for the net from the Z pin of AND cell 402 to the A pin of OR cell 404), calculating the wire propagation delay and output transition time, obtaining load capacitance on pin Z of OR cell 404, calculating the propagation delay through OR cell 404 and its output transition time, obtaining the wire resistance and load capacitance for the net from the Z pin of OR cell 404 to primary output OUT1, and finally calculating the wire propagation delay (and output transition time) from pin Z of OR cell 404 to primary output OUT1.

When a timing destination has been reached, decision block 808 directs the flow to the "Yes" branch. All of the propagation delays encountered along the path from IN1 to OUT1 are summed and recorded in the performance estimate results (steps 816 and 818 respectively). Because there are additional paths remaining (IN2 to OUT1, IN3 to OUT1), decision block 820 directs the processing flow back to step 802, to iterate through the remaining paths.

Eventually, when all desired paths have been traversed, the evaluation is complete. The designer can then examine the estimation results (block 610 in FIG. 8) to determine skew between signal propagation times, time of flight through the logic, etc.

Although the described embodiment is based on lumped capacitance load models, both for the wiring and the cell performance, the system and method of the present invention is not limited to lumped capacitance models. By changing the functions used to calculate the wiring and cell performance (and providing suitable characterization data), the system and method of the present invention may also be used on alternate distributed capacitance load models (such as the Pi model, for example).

Figure 10:
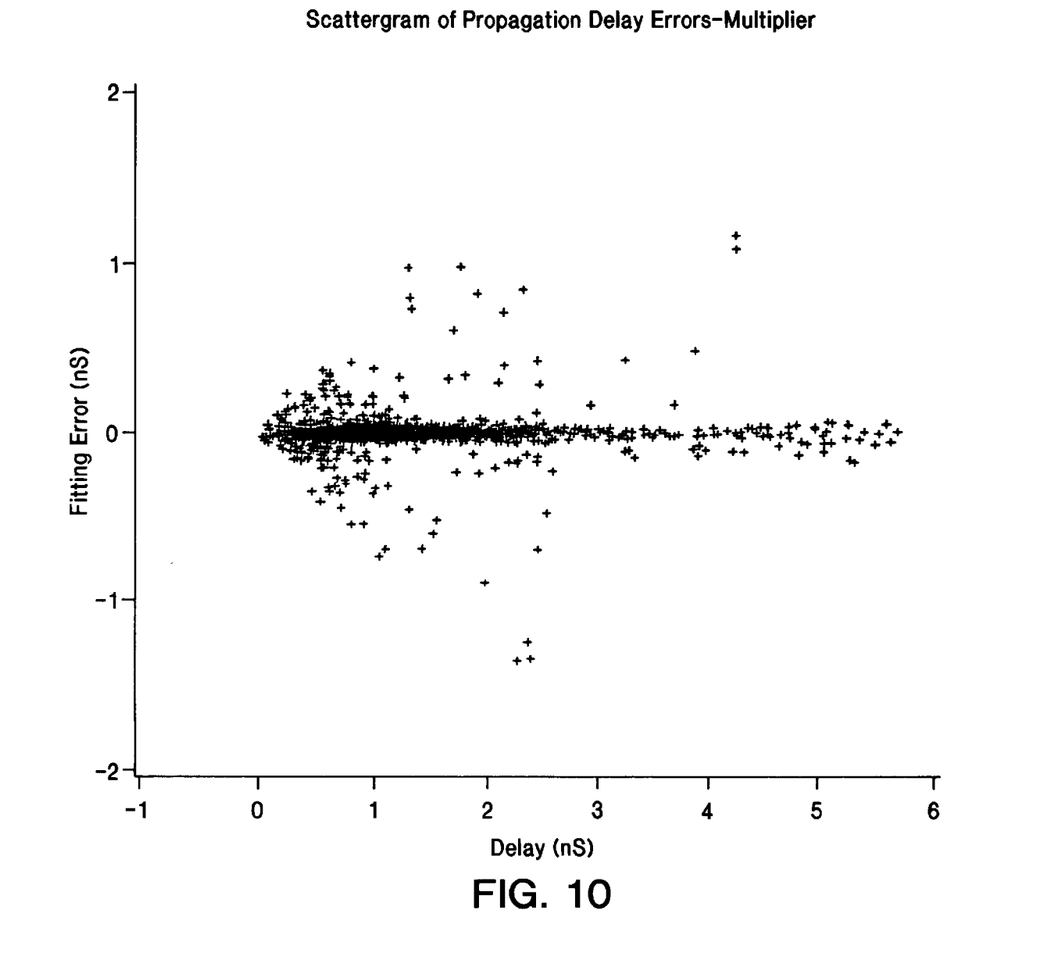
FIG. 10 is scattergram of delay error when using a multiplicative correction factor.
Figure 11:
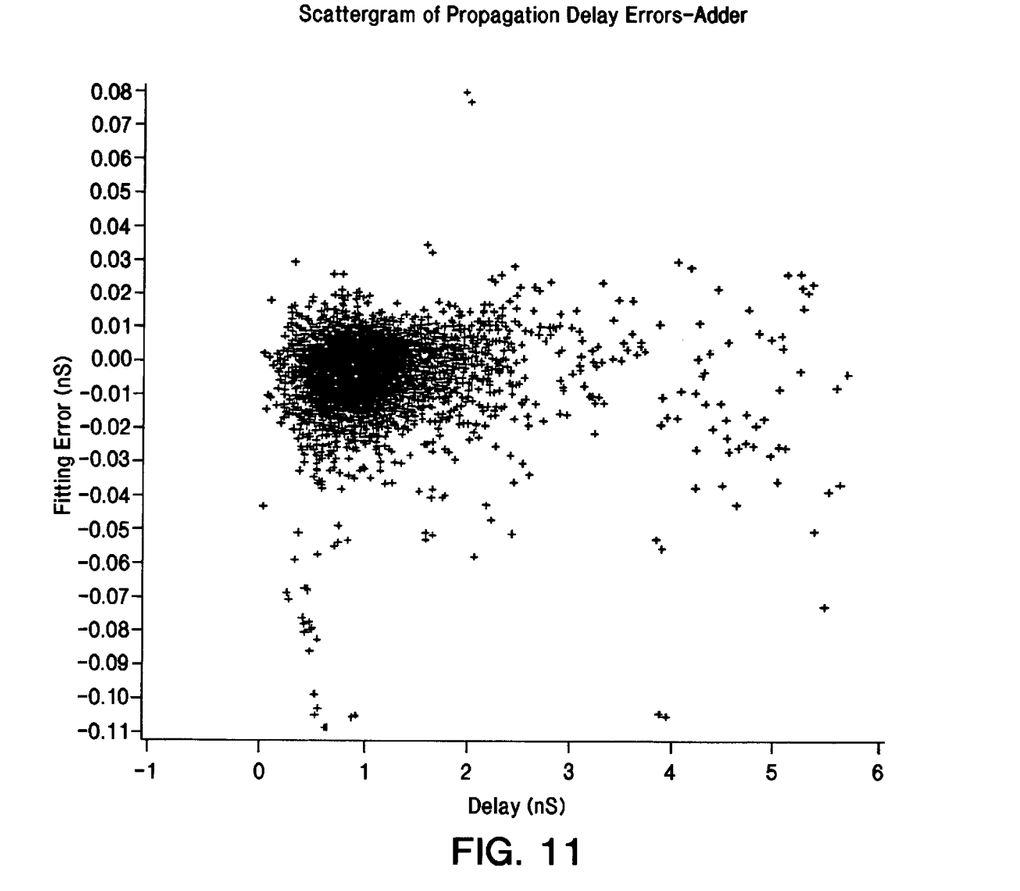
FIG. 11 is a scattergram of delay error when using an additive correction factor in accordance with the present invention.

After modeling propagation errors using the unique method of the present invention, a test was performed to determine the accuracy of the method used. FIGS. 10 and 11 are both scattergrams of delay error. Both FIGS. 10 and 11 depict a voltage range of 2.3–2.7 volts and a temperature range of 0°–100° C. The scattergrams were created by using over 13,500 random samples of load capacitance, input transition, voltage, and temperature across a typical cross section of a CMOS logic cell library. FIG. 10 shows the propagation delay error when the multiplicative derating factor of the prior art method is used. FIG. 11 shows the propagation delay error when using the additive correction approach of the present invention. Note that the multiplier approach used in FIG. 10 yields errors up to 1.3 ns, whereas the adder approach used in FIG. 11 yields errors under +/−0.11 ns.

Figure 12:
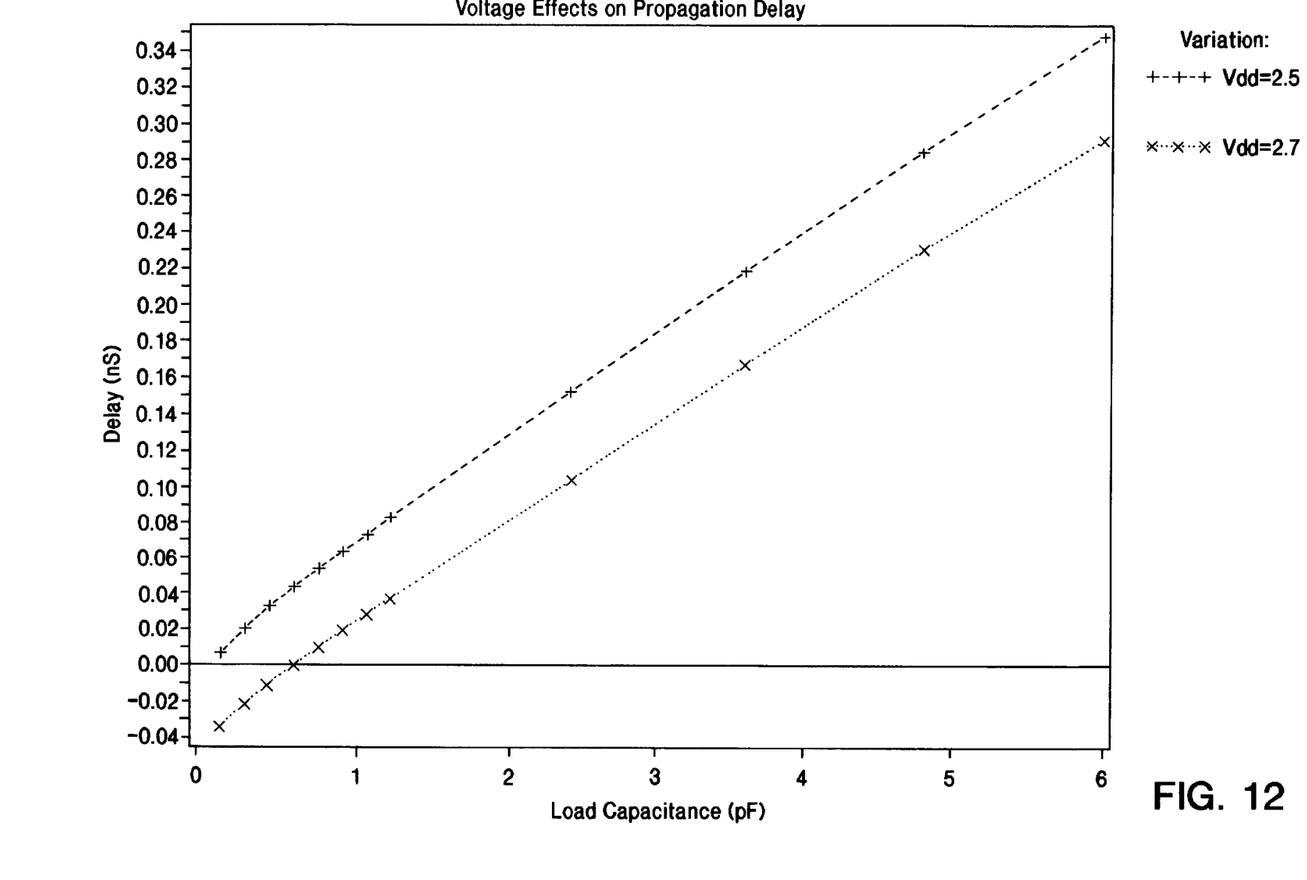
FIG. 12 is a graph depicting voltage effects on propagation delays for two different voltages.

As further evidence that an additive correction factor results in more accurate timing delay predictions, refer to FIG. 12. FIG. 12 depicts voltage effects on propagation delays for two different voltages. If the voltage effect was truly multiplicative, the $V_{DD}=2.5$ curve would pass through the $V_{DD}=2.7$ curve at zero delay, since zero delay multiplied by any number would always result in zero delay. However, the $V_{DD}=2.5$ curve never intersects the $V_{DD}=2.7$ curve. A translation is required to shift the $V_{DD}=2.7$ curve to the $V_{DD}=2.5$ curve. Therefore, the voltage effect must be additive, rather than multiplicative.

Figure 13:
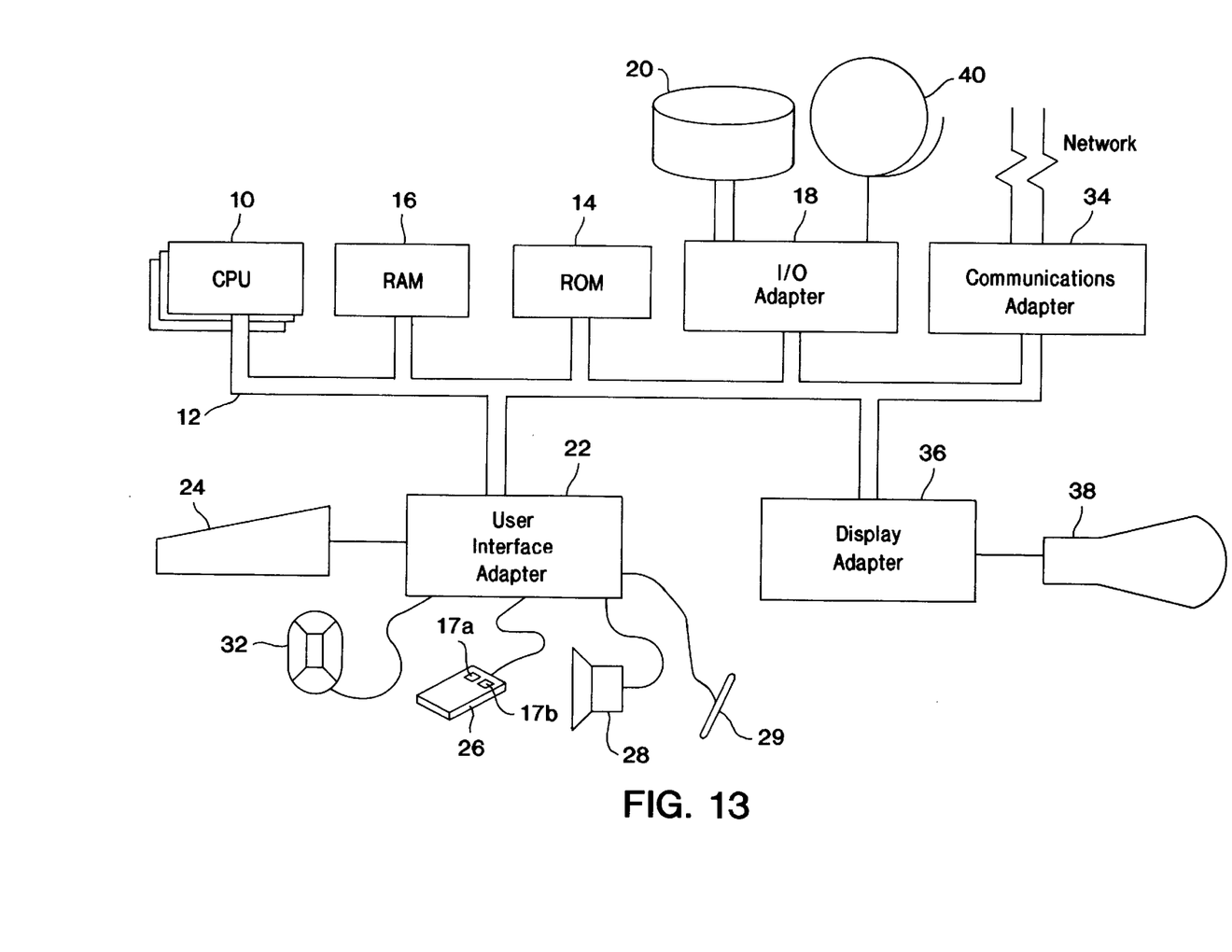
FIG. 13 illustrates an apparatus for implementing the timing simulation method according to the present invention.

The method of the present invention is preferably implemented by an information handling system, such as illustrated in FIG. 13. The invention may be implemented on a variety of hardware platforms, including personal computers, workstations, mini-computers, and mainframe computers. Many of the steps of the method according to the present invention may be advantageously implemented on parallel processors of various types. Referring now to FIG. 13, a typical configuration of an information handling system that may be used to practice the novel method of the present invention will be described. The computer system of FIG. 13 has at least one processor 10. Processor 10 is interconnected via system bus 12 to random access memory (RAM) 16, read only memory (ROM) 14, and input/output (I/O) adapter 18 for connecting peripheral devices such as disk units 20 and tape drives 40 to bus 12, user interface adapter 22 for connecting keyboard 24, mouse 26 having buttons 17a and 17b, speaker 28, microphone 32, and/or other user interface devices such as a touch screen device 29 to bus 12, communication adapter 34 for connecting the information handling system to a data processing network, and display adapter 36 for connecting bus 12 to display device 38. Communication adaptor 34 may link the system depicted in FIG. 13 with hundreds or even thousands of similar systems, or other devices, such as remote printers, remote servers, or remote storage units.

Although the invention has been described with a certain degree of particularity, it should be recognized that elements thereof may be altered by persons skilled in the art without departing from the spirit and scope of the invention. One of the embodiments of the invention can be implemented as sets of instructions resident in the random access memory 16 of one or more computer systems configured generally as described in FIG. 13. Until required by the computer system, the set of instructions may be stored in another computer readable memory, for example in a hard disk drive, or in a removable memory such as an optical disk for eventual use in a CD-ROM drive or a floppy disk for eventual use in a floppy disk drive. Further, the set of instructions can be stored in the memory of another computer and transmitted over a local area network or a wide area network, such as the Internet, when desired by the user. One skilled in the art would appreciate that the physical storage of the sets of instructions physically changes the medium upon which it is stored electrically, magnetically, or chemically so that the medium carries computer readable information. The invention is limited only by the following claims and their equivalents.

What is claimed is:

1. A method of predicting a delay time and an output transition time for a signal through an integrated circuit logic cell having at least one input pin and at least one output pin, comprising the steps of:

providing an input transition time of the signal applied to the at least one input pin;

providing a load capacitance present on the at least one output pin;

calculating a base delay time and a base output transition time at base operating conditions for said signal;

determining an equation characterizing a variation in the base delay time and the base output transition time for an off baseline temperature and an off baseline voltage and expressed in terms of said input transition time and load capacitance;

calculating a first additional delay time due to a change in operating temperature, by using said equation to modify a difference between a base operating temperature and said off baseline temperature;

calculating a second additional delay time due to a change in operating voltage, by using said equation to modify a difference between a base operating voltage and said off baseline voltage;

performing an additive correction to said base delay time and base output transition time for said signal for an off baseline temperature and an off baseline voltage to model a timing performance of said logic cell, by adding said first additional delay time and second additional delay time to said base delay time and base output transition time.

2. A method according to claim 1, wherein said first additional delay time comprises (TEMP−$T_{BASE}$), wherein Tx is the input transition time of the signal applied to the at least one input pin; Cload is the load capacitance present at the at least one output pin; $T_{BASE}$ is a base temperature; TEMP is the off baseline temperature; and $K_4$, $K_5$, and $K_6$ are coefficients.

3. A method according to claim 1, wherein said second additional delay time comprises ($V_{DD-VBASE}$), wherein Tx is the input transition time of the signal applied to the at least one input pin; Cload is the load capacitance present at the at least one output pin; $V_{BASE}$ is a base voltage; $V_{DD}$ is the off baseline voltage; and $K_1$, $K_2$, and $K_3$ are coefficients.

4. A method according to claim 1, wherein said additive correction, $DELAY_{VDD/TEMP}$, in the base delay time, $DELAY_{BASE}$, comprises $(V_{DD}-V_{BASE})+(TEMP-T_{BASE})$, wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1$, $K_2$, $K_3$, $K_4$, $K_5$, and $K_6$ are coefficients.

5. A method according to claim 1, wherein said additive correction, $DELAY_{VDD/TEMP}$, in the base delay time, $DELAY_{BASE}$, comprises $(V_{DD}-V_{BASE})+(TEMP-T_{BASE})+(V_{DD}-V_{BASE})^2$, wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1, K_2, K_3, K_4, K_5, K_6, K_7, K_8$, and $K_9$ are coefficients.

6. A method of designing an integrated circuit, said method comprising the steps of:
  selecting and combining a set of logic cells utilizing delay time data and output transition time data for at least a portion of one of the logic cells, the delay time data and the output transition time data being generated by:
    providing an input transition time of a signal applied to at least one input pin of said one of the logic cells;
    providing a load capacitance present on at least one output pin of said one of the logic cells;
    calculating a base delay time and a base output transition time at base operating conditions for said signal;
    determining an equation characterizing a variation in the base delay time and the base output transition time for an off baseline temperature and an off baseline voltage and expressed in terms of said input transition time and load capacitance;
    calculating a first additional delay time due to a change in operating temperature, by using said equation to modify a difference between a base operating temperature and said off baseline temperature;
    calculating a second additional delay time due to a change in operating voltage, by using said equation to modify a difference between a base operating voltage and said off baseline voltage; and
    performing an additive correction to said base delay time and base output transition time for said signal for an off baseline temperature and an off baseline voltage to model a timing performance of said logic cell, by adding said first additional delay time and second additional delay time to said base delay time and base output transition time.

7. A method according to claim 6, wherein said first additional delay time comprises (TEMP-$T_{BASE}$), wherein Tx is the input transition time of the signal applied to the at least one input pin; Cload is the load capacitance present at the at least one output pin; $T_{BASE}$ is a base temperature; TEMP is the off baseline temperature; and $K_4, K_5$, and $K_6$ are coefficients.

8. A method according to claim 6, wherein said second additional delay time comprises ($V_{DD}-V_{BASE}$) wherein Tx is the input transition time of the signal applied to the at least one input pin; Cload is the load capacitance present at the at least one output pin; $V_{BASE}$ is a base voltage; $V_{DD}$ is the off baseline voltage; and $K_1, K_2$, and $K_3$ are coefficients.

9. A method according to claim 4, wherein said additive correction, $DELAY_{VDD/TEMP}$, in the base delay time, $DELAY_{BASE}$, comprises ($V_{DD}-V_{BASE}$)+(TEMP-$T_{BASE}$), wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1, K_2, K_3, K_4$, $K_5$, and $K_6$ are coefficients.

10. A method according to claim 6, wherein said additive correction, $DELAY_{VDD/TEMP}$, in the base delay time, $DELAY_{BASE}$, comprises ($V_{DD}-V_{BASE}$)+(TEMP-$T_{BASE}$)+ ($V_{DD}-V_{BASE}$)$^2$, wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1, K_2, K_3, K_4, K_5, K_6, K_7, K_8$, and $K_9$ are coefficients.

11. A method of simulating an integrated circuit, comprising the steps of:
  selecting and combining a set of logic cells utilizing delay time data and output transition time data for at least a portion of one of the logic cells, the delay time data and output transition time data being generated by:
    providing an input transition time of a signal applied to at least one input pin of said one of the logic cells;
    providing a load capacitance present on at least one output pin of said one of the logic cells;
    calculating a base delay time and a base output transition time at base operating conditions for said signal;
    determining an equation characterizing a variation in the base delay time and the base output transition time for an off baseline temperature and an off baseline voltage and expressed in terms of said input transition time and load capacitance;
    calculating a first additional delay time due to a change in operating temperature, by using said equation to modify a difference between a base operating temperature and said off baseline temperature;
    calculating a second additional delay time due to a change in operating voltage, by using said equation to modify a difference between a base operating voltage and said off baseline voltage; and
    performing an additive correction to said base delay time and base output transition time for said signal for an off baseline temperature and an off baseline voltage to model a timing performance of said logic cell, by adding said first additional delay time and second additional delay time to said base delay time and base output transition time.

12. A method according to claim 11, wherein said first additional delay time comprises (TEMP-$T_{BASE}$), wherein Tx is the input transition time of the signal applied to the at least one input pin; Cload is the load capacitance present at the at least one output pin; $T_{BASE}$ is a base temperature; TEMP is the off baseline temperature; and $K_4, K_5$, and $K_6$ are coefficients.

13. A method according to claim 11, wherein said second additional delay time comprises ($V_{DD}-V_{BASE}$), wherein Tx is the input transition time of the signal applied to the at least one input pin; Cload is the load capacitance present at the at least one output pin; $V_{BASE}$ is a base voltage; $V_{DD}$ is the off baseline voltage; and $K_1, K_2$, and $K_3$ are coefficients.

14. A method according to claim 11, wherein said additive correction, $DELAY_{VDD/TEMP}$, in the base delay time, $DELAY_{BASE}$, comprises ($V_{DD}-V_{BASE}$)+(TEMP-$T_{BASE}$), wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1, K_2, K_3, K_4$, $K_5$, and $K_6$ are coefficients.

15. A method according to claim 11, wherein said additive correction, $DELAY_{VDD/TEMP}$, in the base delay time, $DELAY_{BASE}$, comprises ($V_{DD}-V_{BASE}$)+(TEMP-$T_{BASE}$)+ ($V_{DD}-V_{BASE}$)$^2$, wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1, K_2, K_3, K_4, K_5, K_6, K_7, K_8$, and $K_9$ are coefficients.

16. An information handling system, comprising:
  one or more processors;
  input/output means;
  storage means;
  one or more images of an operating system for controlling operation of said processors; and means for predicting a delay time and an output transition time for a signal through an integrated circuit logic cell having at least one input pin and at least one output pin, said means for predicting comprising:

means for providing an input transition time of [the] a signal applied to the at least one input pin;

means for providing a load capacitance present on the at least one output pin;

means for calculating a base delay time and a base output transition time at base operating conditions for said signal;

means for calculating a first additional delay time due to a change in operating temperature, by using an equation characterizing a variation in the base delay time and the base output transition time for an off baseline temperature and an off baseline voltage and expressed in terms of said input transition time and load capacitance, said equation being used to modify a difference between a base operating temperature and said off baseline temperature;

means for calculating a second additional delay time due to a change in operating voltage, by using said equation to modify a difference between a base operating voltage and said off baseline voltage; and means for performing an additive correction to said base delay time and base output transition time for said signal for an off baseline temperature and an off baseline voltage to model a timing performance of said logic cell, by adding said first additional delay time and second additional delay time to said base delay time and base output transition time.

17. An information handling system according to claim 16, wherein said first additional delay time comprises (TEMP$-T_{BASE}$), wherein Tx is the input transition time of the signal applied to the at least one input pin; Cload is the load capacitance present at the at least one output pin; $T_{BASE}$, is a base temperature; TEMP is the off baseline temperature; and $K_4$, $K_5$, and $K_6$ are coefficients.

18. An information handling system according to claim 16, wherein said second additional delay time comprises ($V_{DD}-V_{BASE}$), wherein Tx is the input transition time of the signal applied to the at least one input pin; Cload is the load capacitance present at the at least one output pin; $V_{BASE}$ is a base voltage; $V_{DD}$ is the off baseline voltage; and $K_1$, $K_2$, and $K_3$ are coefficients.

19. An information handling system according to claim 16, wherein said additive correction, DELAY$_{VDD/TEMP}$, in the base delay time, DELAY$_{BASE}$, comprises ($V_{DD}-V_{BASE}$)+ (TEMP$-T_{BASE}$), wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1$, $K_2$, $K_3$, $K_4$, $K_5$, and $K_6$ are coefficients.

20. An information handling system according to claim 16, wherein said additive correction, DELAY$_{VDD/TEMP}$, in the base delay time, DELAY$_{BASE}$, comprises ($V_{DD}-V_{BASE}$)+ (TEMP$-T_{BASE}$)+($V_{DD}-V_{BASE}$)$^2$, wherein Tx is the input transition time of the signal applied to the at least one input pin; Cload is the load capacitance present at the at least one output pin; $V_{BASE}$ is a base voltage; $V_{DD}$ is the off baseline voltage; $T_{BASE}$ is a base temperature; TEMP is the off baseline temperature; and $K_1$, $K_2$, $K_3$, $K_4$, $K_5$, $K_6$, $K_7$, $K_8$, and $K_9$ are coefficients.

* * * * *